United States Patent

Stuby

[15] 3,648,131

[45] Mar. 7, 1972

[54] HOURGLASS-SHAPED CONDUCTIVE CONNECTION THROUGH SEMICONDUCTOR STRUCTURES

[72] Inventor: Kenneth P. Stuby, Wappingers Falls, N.Y.

[73] Assignee: International Business Machines Corporation, Armonk, N.Y.

[22] Filed: Nov. 7, 1969

[21] Appl. No.: 874,729

[52] U.S. Cl. ..................317/235 R, 317/235 D, 317/235 N, 317/235 AJ, 317/235 F, 317/234 N, 317/235 AS

[51] Int. Cl. ..........................................................H01l 19/00

[58] Field of Search..................................................317/235

[56] References Cited

UNITED STATES PATENTS

| | | | |
|---|---|---|---|
| 3,256,465 | 6/1966 | Weissenstern et al. | 317/235 |
| 3,343,256 | 9/1967 | Smith et al. | 317/235 |
| 3,372,070 | 3/1968 | Zuk | 317/235 |
| 3,418,545 | 12/1968 | Hutson | 317/235 |
| 3,445,686 | 5/1969 | Rutz | 317/235 |
| 3,454,835 | 7/1969 | Rosvold | 317/235 |
| 3,456,335 | 7/1969 | Hennings et al. | 317/235 |
| 3,462,650 | 8/1969 | Hennings et al. | 317/235 |

OTHER PUBLICATIONS

IBM Tech. Disel Bul., Agusta et al., " Monolithic Semiconductor Packaging Arrangement" Vol. 10, No. 1, June ' 67 page 94

*Primary Examiner*—Jerry D. Craig

*Attorney*—Hanifin and Jancin and Theodore E. Galanthay

[57] ABSTRACT

An integrated semiconductor structure including the fabrication thereof, and more particularly, an improved means for interconnecting the two planar surfaces of a semiconductor wafer. To provide the electrically conductive interconnections through the wafer, a hole is etched, insulated, and metallized. Active or passive devices may be formed on either or both sides of the wafer and connected to a substrate by solder pads without the use of beam leads or flying lead bonding.

7 Claims, 12 Drawing Figures

INVENTOR
KENNETH P. STUBY
BY
AGENT

HOURGLASS-SHAPED CONDUCTIVE CONNECTION THROUGH SEMICONDUCTOR STRUCTURES

CROSS-REFERENCES TO RELATED APPLICATIONS OR PATENTS

1. Ser. No. 640,610, filed May 23, 1967, now U.S. Pat. No. 3,539,876, issued Nov. 10, 1970 inventors Irving Feinberg, et al.

2. Ser. No. 716,105, filed Mar. 26, 1968, inventor John Blake.

3. U.S. Pat. No. 3,429,040, issued Feb. 25, 1969, inventor Lewis F. Miller.

All of the above are assigned to the assignee of the instant application.

BACKGROUND OF THE INVENTION

1. Field of the Invention

My invention relates generally to integrated semiconductor structure including the fabrication thereof and, more particularly, to interconnecting the two planar surfaces of a semiconductor wafer.

2. Description of the Prior Art

There are presently two generally practiced approaches in the manufacture of semiconductor devices. In a first approach, a plurality of semiconductor devices are formed on one surface of a wafer of semiconductor material, the wafer being diced after formation of the devices to give a large number of semiconductor chips. Each chip may include on it one semiconductor device, such as a transistor, or a plurality of semiconductor devices forming an electrical circuit, for example, a storage cell. In a second approach, after a plurality of devices have been formed on the surface of a semiconductor wafer, a discretionary wiring pattern is developed on the wafer surface to connect together those devices which have acceptable performance, devices having an unacceptable performance not being wired into the circuit. The second approach is that used in large scale integration (LSI).

After the formation of an integrated circuit by one of these aforementioned techniques, the resultant semiconductor structure must further be electrically and mechanically attached to a substrate in order to provide connections to other circuit elements or structures. A number of connecting schemes such as beam leads and flying lead bonding are well known but suffer from excessive cost. One of the most reliable connecting techniques is the use of a solder pad as described in the above-referenced patent to L. F. Miller. Such solder pad bonding techniques have become so popular as to be a leader in the class of semiconductor structures called "flip chip" devices. This flip chip technology has developed because it has been necessary to place the solder pad connection and active devices on the same surface of the semiconductor wafer. Thus, since all the active devices are on the bottom surface of the wafer, the top surface of the wafer remains unused and consequently wasted. Any attempt to place devices on the top surface of the wafer has led to the requirement of connecting these devices by such means as discrete wiring which is excessively time consuming, expensive, and unreliable.

Notwithstanding these problems, in some applications such as optical semiconductor devices, it has been necessary to place active devices such as light-sensitive diodes or light-emitting diodes (LED) on the top surface of the wafer with the resultant disadvantages set forth. A great need has therefore developed for an improved interconnecting technique for active devices on the top surface of a wafer. In addition to the foregoing, the existence of the aforementioned problems has limited microminiaturization by preventing the efficient stacking of semiconductor wafers, particularly for circuits requiring combinations of noncompatible semiconductor processing (i.e., PNP/NPN or FET/bipolar).

SUMMARY OF THE INVENTION

Accordingly, it is an object of this invention to provide an improved integrated semiconductor structure.

It is a further object of this invention to provide an improved semiconductor structure having means for interconnecting the two planar surfaces of a semiconductor wafer.

It is a still further object of this invention to provide a plurality of conducting paths through a semiconductor wafer.

It is an even further object of this invention to provide an improved fabrication method for integrated semiconductor structures having electrically conductive paths for interconnecting the two planar surfaces of a semiconductor wafer.

It is another object of this invention to provide improved thermal dissipation means, for integrated semiconductor structures.

It is a specific object of this invention to electrically connect devices formed in the top surface of the wafer, with devices formed in the bottom surface of said wafer.

Another specific object of this invention is to electrically connect devices formed in the top surface of a semiconductor wafer to the bottom surface of the wafer, which is in turn attached to a substrate.

It is another specific object of this invention to electrically connect optical devices formed in the top surface of a wafer with associated circuitry formed in the bottom surface of said wafer.

A still further object of this invention is to precisely position optical devices formed in the top surface of a semiconductor wafer with respect to a substrate.

Lastly, it is an object of this invention to form three dimensionally integrated semiconductor circuits by stacking a plurality of semiconductor wafers of similar or mixed processing technologies (i.e., NPN, PNP; FET, Bipolar, etc.).

In accordance with my invention, a semiconductor wafer or chip having an oxide coating on both planar surfaces, is further coated with a photoresist material. Such photoresist materials and methods of application are well known in the art. Corresponding areas on the two surfaces are selectively exposed to light by use of optical masks having apertures at desired locations. The photoresist is then washed away from all exposed areas and an etching solution is simultaneously applied to both planar surfaces, in order to etch "windows" through the oxide layer. After holes have been etched through the oxide, the remaining photoresist is washed away, since the oxide layer now acts as a mask while a preferential etching solution is applied to both surfaces. The preferential etching solution etches along particular crystallographic planes of the semiconductor wafer providing highly predictable through-hole structure. Devices are now formed in one or both surfaces of the wafer and a metallization pattern is applied. The through-holes are metallized during the metallization step. The resultant structure is further attached to a substrate, for example, by means of solder pads, forming more complex integrated structures.

The foregoing and other objects, features and advantages of my invention will be apparent from the following more particular description of the preferred embodiments of the invention, as illustrated in the accompanying drawings.

DESCRIPTION OF THE PREFERRED EMBODIMENTS

In the description of my invention, reference is made to presently used terminology and fabrication techniques. These are to be considered words of description rather than words of limitation, as equivalents will become readily apparent to those skilled in the art. With the foregoing in mind, by wafer is meant a thin semiconductor wafer in the order of 2–15 mils thick. This range, however, could be expanded to include thinner or thicker wafers. The wafer is commonly sliced from a monocrystalline silicon rod usually lightly doped to a $P^-$ impurity concentration. Other semiconductor materials such as GaAs are equally applicable. By device, active device, or circuit element is meant an electronic component such as a transistor, diode, resistor, etc., formed on or in a surface of the wafer. Most commonly, such devices are formed by diffusion and/or epitaxial deposition. By oxide coating is meant preferably silicon dioxide ($SiO_2$) which is either thermally grown, deposited by pyrolytic deposition, or applied by an RF sputtering technique. After a wafer has been processed to include devices on one or both of its planar surfaces, it is ready for the application of metallization, and dicing into individual semiconductor chips. Since the relative size of chips and wafers is an arbitrary choice of design, as applied to this invention, wafer and chip can be used interchangeably.

Figure 1:
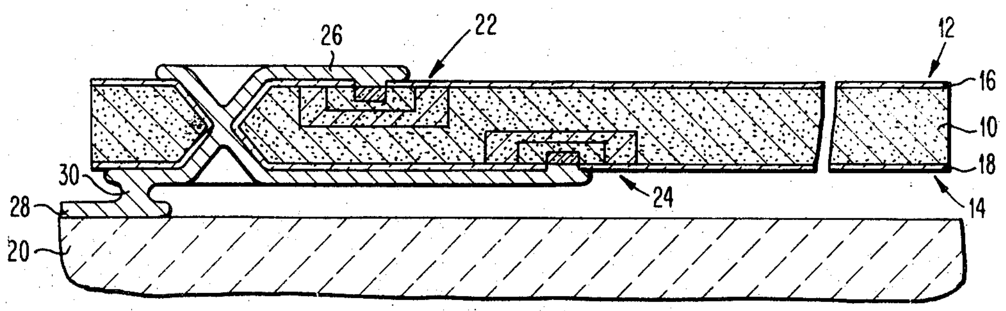
FIG. 1 is a cross-sectional fragmentary view of a preferred embodiment of my invention.

Refer now to FIG. 1 for a description of the structure in accordance with a preferred embodiment. Wafer 10 having a top planar surface 12 and a bottom planar surface 14 is shown as the supporting member for transistors 22 and 24. Top surface 12 has a coating 16 of insulating material such as silicon dioxide and bottom surface 14 has a similar coating 18 of silicon dioxide. These layers of oxide coating are accumulated during the various masking and diffusion steps in the formation of transistors 22 and 24. For purposes of illustration, a single layer of oxide has been shown on each of the planar surfaces. In practice, a separate layer of oxide is deposited for each diffusion step so that several oxide layers remain. Transistors 22 and 24 are shown offset from each other, however, it is possible for them to be formed symmetrically in registration with each other in accordance with the teachings of the above-referenced copending application to John Blake. The oxide covers all exposed portions of the wafer and insulates the wafer from electrical contact in all areas except where the oxide has been specifically etched away. In FIG. 1, such etched-away portions appear at the emitter regions of transistors 22 and 24 and are therefore contacted by metallization 26. In the embodiment shown, the metallization 26 electrically connects the emitter of transistor 22 formed in the top surface of wafer 10 with the emitter of transistor 24 in the bottom surface of wafer 10. This particular configuration results in a common emitter circuit. Wafer (or chip) 10 is further mounted on substrate 20 which is typically a multilayer ceramic substrate which contains a conductive circuit pattern. A portion of this conductive circuit pattern 28 is shown connected to metallization 26 by means of solder pad 30. A well-known technique for forming connecting solder pad 30 is illustrated in the above-referenced patent to L. F. Miller. The embodiment of FIG. 1 therefore shown a monocrystalline wafer (or chip) 10 of semiconductive material having semiconductive devices (22 and 24) formed in each planar surface and a conductive path, exemplified by metallization 26, extending through wafer 10 and electrically connecting the active devices on both planar surfaces of wafer 10 to substrate 20.

Figure 2:
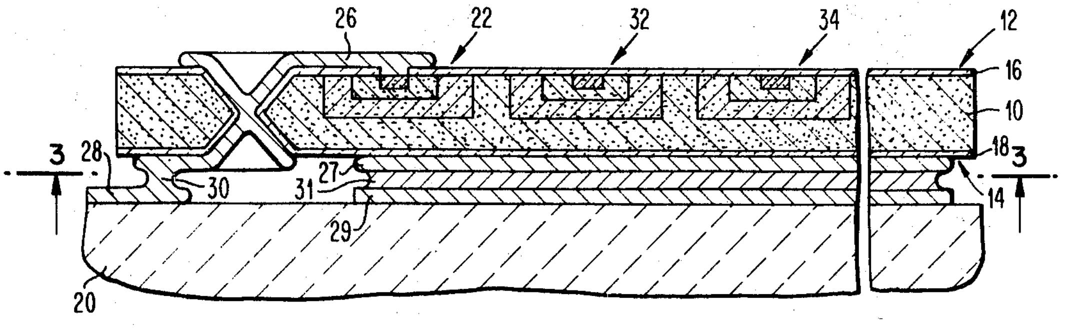
FIG. 2 is a cross-sectional fragmentary view of another embodiment, particularly illustrating the thermal dissipation feature of my invention.

Refer now to FIG. 2 which shows an alternate embodiment, items corresponding to FIG. 1 being identified by corresponding reference numerals. Transistors 32 and 34 have been added and transistor 24 has been deleted to show active devices advantageously formed in only top surface 12 of wafer 10. The metallization for transistors 32 and 34 is not specifically shown, in order to maintain clarity in the illustration. It is of course obvious that electrical connections to all active regions of all devices are made in the manner similar to that shown at the emitter of transistor 22. The specific improvement illustrated by FIG. 2 is thermal path 31 connecting wafer 10 with substrate 20. Metallization 27 on wafer 10 and metallic layer 29 on substrate 20 are electrically insulated from all the operative devices. The purpose of metal 27 and 29 is to form an adherent surface which is wettable by solder so that wafer 10 and substrate 20 can be joined by thermal path 31 which is similar in structure to solder pad 30. An efficient thermal path 31 can also be provided by means of a gold-plated copper insert between the wafer and the substrate. In this alternate embodiment, it is seen that if active devices such as transistors 22, 32 and 34, are only formed in top surface 12 of wafer 10, these active devices are electrically connected to circuit pattern 28 on substrate 20 by means of solder pad 30. This latter means of connection is far less expensive and more reliable than any known alternative techniques for electrically connecting devices formed in top surface 12 to substrate 20.

Figure 3:
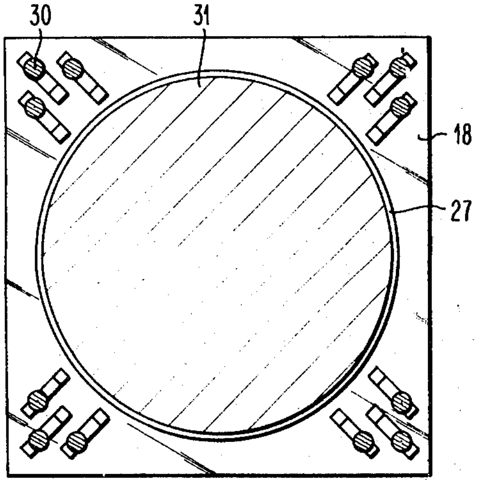
FIG. 3 is a top view of the embodiment of FIG. 2 taken along section line 3—3.

With continued reference to FIG. 2, refer also to FIG. 3 which illustrates a top view of the embodiment of FIG. 2 along section line 3—3. Solder pad 30 is specifically indicated although in normal practice a plurality of such solder pads like pad 30 as shown, connect wafer 10 to substrate 20. Note the extent of thermal path 31 under almost the entire wafer (or chip) 10. Heat is conducted away from transistors 22, 32, 34, etc., to ceramic substrate 20. This advantageous thermal dissipation is made possible by the ability to reliably connect the devices formed in the top surface of wafer 10 to ceramic 20. In the presently known flip chip technology, transistors 22, 32, 34, etc., would be formed in bottom surface 14. It is readily apparent that in such a flip chip configuration, it would not be possible to construct an efficient thermal path directly attachable to the substrate 20.

Figure 4:
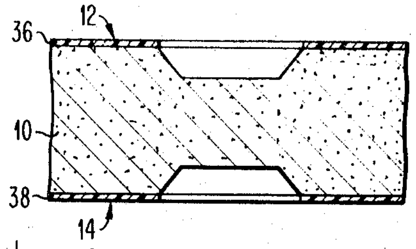
FIGS. 4–7 are cross-sectional fragmentary views arranged as a flow chart to illustrate the fabrication process for making the conductive through-holes.
Figure 5:
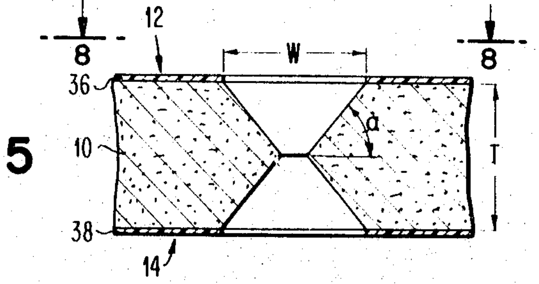
Figure 8:
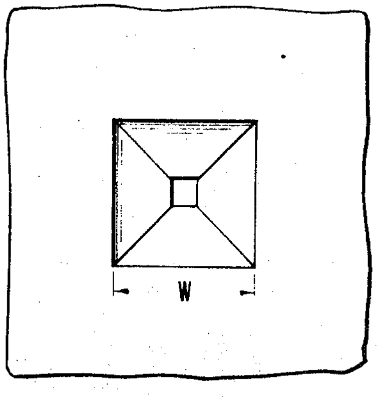
FIG. 8 is a top view of the structure as shown in FIG. 5 along section lines 8—8, illustrating the square hourglass shape of the completely etched through-hole.
Figure 8A:
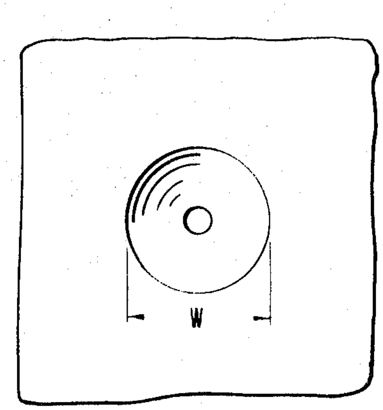
FIG. 8A is an alternate embodiment showing the etched through-hole in a circular hourglass configuration.

Refer now to FIGS. 4–7 for a description of the fabrication of a conductive connection through the wafer 10. Structure previously disclosed in preceding drawings is referred to by corresponding reference numerals. Prior to arriving at the structure as shown in FIG. 4, both the top and bottom planar surfaces of the wafer 10 are selectively masked in corresponding areas. The selective masking is performed by well-known photolithographic techniques. First, the wafer is coated with a photoresist material 36 and 38. Identical optical masks are then aligned on both planar surfaces. Some care must be exercised in order to achieve perfect alignment. Once the masks (not shown) are properly aligned, the photoresist layers 36 and 38 are exposed; the selectively exposed portions being washed away to expose the surface of the wafer. The wafer is now ready for the forming of the through-hole. In my preferred embodiment, a preferential etching technique is employed. Preferential etching permits the forming of a hole in a crystal along a well-defined crystallographic plane. FIG. 4 shows a partially etched wafer while FIG. 5 shows a hole completely etched through. As shown, the through-hole is in the shape of a symmetrical hourglass, however, it can be etched to any degree of asymmetry if desired. Asymmetrically etched holes can be formed most easily by varying the relative time that the two surfaces are etched. Looking at either the top or bottom surfaces of the wafer, as for example along section line 8—8, the shape of the through-hole is determined by the shape of the aperture in the mask that was used to expose the photoresist. Thus, in FIG. 8 a square hourglass shape is shown. As an alternative, FIG. 8A illustrates a round hourglass shape. It is readily apparent that any such shape is possible. In a preferred method, wafer 10 is first oxidized on both planar surfaces. A layer of silicon dioxide ($SiO_2$) is grown on silicon wafer 10 to a thickness of approximately 5,000 angstroms, which is somewhat thicker than oxide masks used for diffusion processes. This oxide layer is then coated with photoresist material, the photoresist masking pattern being formed by well known photolithographic techniques. Using the photoresist pattern as a mask, "windows" are etched into the silicon oxide layer. The photoresist layer is then removed since the silicon dioxide acts as a mask for the etching of the through-hole. Subsequent to the etching of the through-hole, the remaining silicon dioxide ($SiO_2$) layer is removed for subsequent processing of the wafer.

With continued reference to FIG. 4–7, and particular reference to FIG. 5, the detailed method of forming the through-hole is further described. For purposes of illustration, assume that the thickness "T" of wafer 10 is approximately 8 mils. Assume also that the wafer is substantially in a [100 ] crystallographic orientation and lightly doped with P-type impurities such as boron. A basic etching solution such as NaOH or KOH is used. KOH produces a somewhat smoother surface. These etching solutions are preferential etching solutions etching along well-defined crystallographic planes. In the present example, the angle "*a*" is approximately 55°. This is the angle theoretically expected for [100] orientation material, and is obtained in actual practice. Although my invention also applies to material oriented in other crystallographic planes, such as [111] or [110], the angle "*a*" will of course vary. With the preferential etching solution at approximately 75° C. an etching rate of approximately 1 micron per minute is obtained. This rate can be increased by increasing the temperature. By etching simultaneously from both surfaces, the resultant through-hole is obtained in half the time. The width W in this particular example is approximately 9½to 10 mils. This width is a function of the size of the aperture in the optical mask and can be varied. For example, different values of width W are desired for different thickness T of wafer 10 as well as for variable widths at the throat of the hourglass. This preferred technique for forming the through-holes uniquely lends itself to well-known masking techniques and batch processing. However, other techniques such as the use of electron guns or laser beams will suggest themselves to those skilled in the art.

Figure 6:
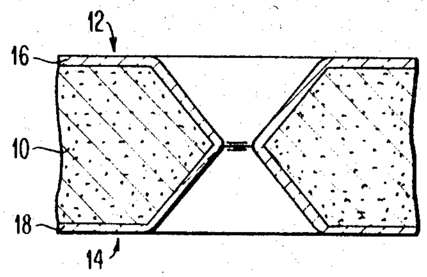

Refer now to FIG. 6 which shows the wafer 10 with oxide layers 16 and 18 applied to the top and bottom surfaces, respectively. In practice, a separate oxidation step to oxidize the through-hole is performed prior to subsequent process steps. The oxide can also be grown simultaneously with any of the oxidation steps required for the forming of the semiconductor devices. The particular time during the processing that the walls of the through-hole are oxidized is not critical. Note, however, that the through-hole remains open after application of the $SiO_2$ which is approximately 5,000 angstroms thick along the walls of the through-hole.

Figure 7:
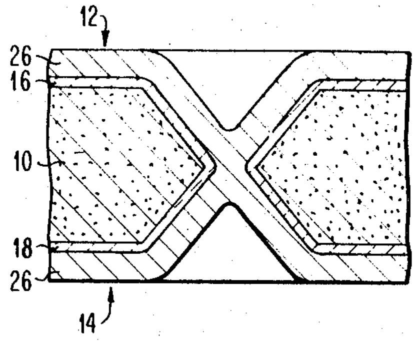

After the silicon exposed by the forming of the through-hole has been oxidized, the through-holes are metallized as illustrated in FIG. 7. For the step of metallization, any well-known metallizing process produces satisfactory results. With the technique of aluminum deposition, the thickness of the aluminum metallization layer 26 is about 20,000 angstroms. Note that the metallization 26 closes the throat of the hourglass. Good conduction, however, is obtained whether the metallization closes the throat or not. The particular time during the fabrication process that metallization takes place is not critical. In my preferred embodiment, metallization of the through-holes is performed simultaneously with the metallization of the remainder of the device. This is most convenient in that the same amount of time required for applying the surface metallization also metallizes the through-hole as shown in FIG. 7. Metallization is deposited through metal masks, and deposition takes place in all unmasked portions of the wafer surface. I prefer to form the through-holes prior to the forming of devices in the wafer in order not to affect the characteristic of the devices during the thermal processes associated with the forming of the through-holes. When $SiO_2$ is used to mask the wafer for the forming of the through-holes, a relatively thick layer of $SiO_2$ is required. The application of such a thick layer of $SiO_2$ could potentially affect the characteristics of existing devices. Accordingly, by forming the through-holes first, semiconductor devices can be formed in the surface of the wafer by customary and well-known techniques. Also, by forming the through-holes first, they can be oxidized and metallized simultaneously with subsequent steps required for the forming of the devices.

Figure 9:
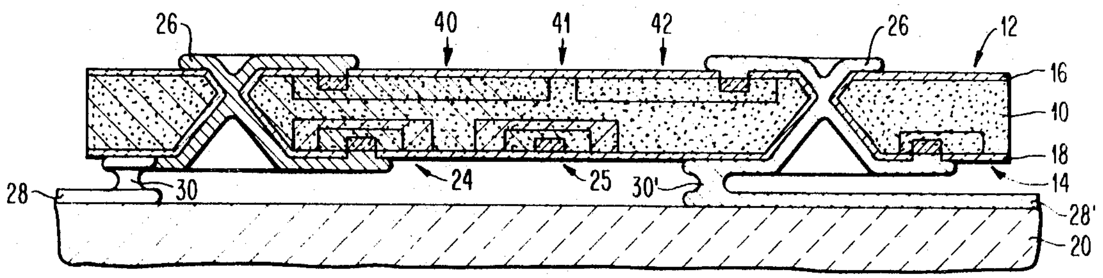
FIG. 9 is a cross-sectional fragmentary view illustrating optical devices on the top surface of a chip with a modification in the shape of the through-hole.

A particular advantage of my invention is illustrated by the embodiment of FIG. 9. Corresponding items have again been designated by corresponding reference numerals. In this embodiment, optical devices 40 and 42 have been formed in top surface 12 of wafer 10. These optical devices have been shown as diodes and can be either light-sensitive diodes or light-emitting diodes, as required. Two diodes 40 and 42 have been shown with a junction isolation region 41 therebetween. However, one such diode or any number of such diodes is possible. Since optical devices require a relatively large amount of surface area, the hourglass-shaped through-holes have been asymmetrically formed in order to leave a larger surface area available on top surface 12. Metallization 26 connects the active regions of diodes 40 and 42 directly to any specified metallized layer (such as 28 or 28') on ceramic 20 via solder pads such as 30 and 30'. Note that pad 30' can be placed anywhere and need not be along the periphery of the chip or wafer 10. Metallization 26 also connects diode 40 to transistor 24. Transistor 25 is not shown connected to any other device merely for the purpose of maintaining clarity in the illustration.

The unique advantage of the FIG. 9 embodiment, is that the optical semiconductive devices formed in the top surface of wafer 10 are in precise spaced relationship to, and in electrical contact with, the devices formed in the bottom surface of the wafer. This allows photosensitive devices to be in close proximity to associated circuitry. Moreover, the solder pad bonding technique employed in this inventive combination, permits a very accurate placement of chip 10 in relation to substrate 20. In fact, chips initially slightly misplaced are pulled into accurate position by the solder pad bonding technique in accordance with the L. F. Miller patent. Such a precise spaced relationship has a unique advantage in that the physical location of optical semiconductor devices is extremely important.

Figure 10:
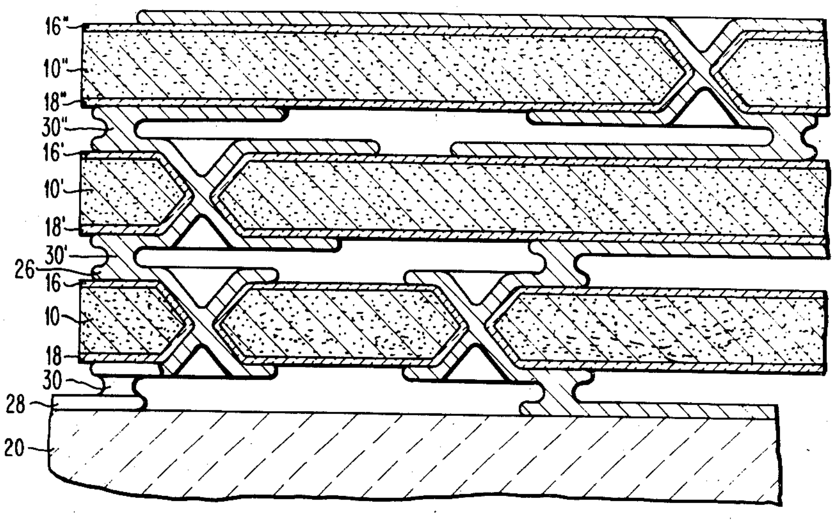
FIG. 10 is a still further embodiment of my invention in cross-sectional fragmentary view showing a plurality of chips stacked for three-dimensional integration.

Refer now to FIG. 10 in which corresponding structure has again been designated by corresponding reference numerals. FIG. 10 shows a novel application of the concept of my invention by permitting wafers or chips to be stacked thereby providing a three-dimensionally integrated semiconductor structure. The plurality of wafers 10, 10' and 10'' form the supporting members for the semiconductor devices (not shown) formed in the planar surfaces of said wafers. As illustrated, a device formed in the top surface of wafer 10'' can be electrically connected to the metallizing layer 28 on substrate 20, or to any other device on any other planar surface, entirely by solder pads. It has been previously pointed out that this type of connection is less expensive and more reliable than any other known technique. As a suitable alternative, any of wafers 10, 10' and 10'' can be used as a metallized interconnecting structure and have no devices formed in its planar surfaces. Thus, it is possible to form a multilevel metallized interconnecting structure and eliminate crossovers in the metallized layer in a chip. Moreover, diverse devices formed by various processes (e.g., FET, bipolar, etc.) are compatibly interconnected by this technique. In the example shown, wafer 10 could include either bipolar transistors or FET's; wafer 10' could be a metallized interconnecting structure; and wafer 10'' could include in its top surface a plurality of light-emitting diodes. These diodes are thereby positioned in a precise spaced relationship to the ceramic substrate and the semiconductor structures formed by diverse technologies are compatibly connected by means of solder pads in a unitary multilevel three-dimensionally integrated semiconductor structure.

Figure 11:
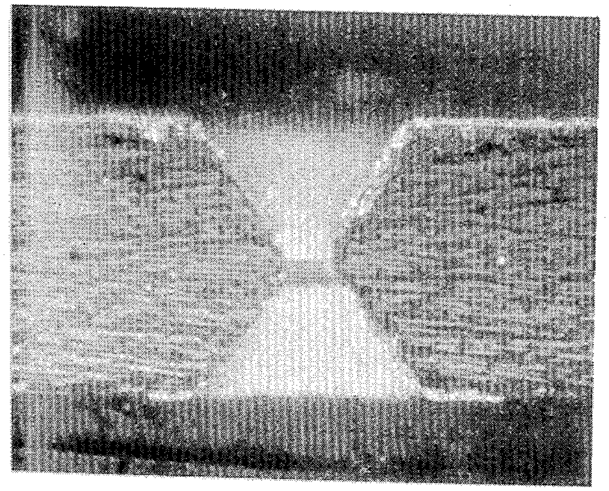
FIG. 11 is a photograph depicting the embodiment of FIG. 7.

Since the conductive connection through each of the wafers 10, 10′ and 10″ is an important aspect of my invention, a photograph is provided as FIG. 11. Note that FIG. 11 substantially shows the structure of FIG. 7 which has been previously described. FIG. 11 is a photomicrograph enlarged approximately 256 times. It shows the wafer in cross section at a place where the through-hole is etched, oxidized, and metallized. The magnification is inadequate to show the oxide layer, but the continuous metallization is seen. What may appear as irregularities in shape and shading is a result of sectioning and lighting for the photograph.

In conclusion, there has been described an improved integrated semiconductor structure having means for interconnecting the two planar surfaces of a semiconductor wafer. The interconnections for the two planar surfaces are conducting paths extending through the semiconductor wafer thereby establishing electrical contact with devices formed in the top surface of the wafer and a ceramic substrate. Also, devices such as optical devices, for example, can be formed in the top surface of the wafer and interconnected to devices on the bottom surface of the wafer or to a substrate, entirely by solder pad bonding. It has also been shown how my invention lends itself to the stacking of a plurality of semiconductor wafers thereby forming three-dimensionally integrated semiconductor assemblies. Furthermore, a novel thermal dissipation means for the semiconductor structure has been disclosed. Lastly, it has been shown how the method of fabricating the improved integrated semiconductor structure is coextensive with the inventive concept of the structure.

While the invention has been particularly shown and described with reference to preferred embodiments, it will be understood by those skilled in the art that various changes in form and detail may be made therein without departing from the spirit and scope of the invention.

I claim:

1. An integrated semiconductor structure comprising:

a planar monocrystalline supporting member having top and bottom planar surfaces, and having hourglass-shaped through-holes therein formed along crystallographic faces of said monocrystalline supporting member, such that said crystallographic faces forming said hourglass-shaped through-holes intersect at obtuse angles;

an optical semiconductor device having at least one active region, formed in the top planar surface of said supporting member;

a metallization layer on selected portions of the top and bottom planar surfaces of said supporting member, said metallization layer on the top planar surface in electrical contact with at least one of the said regions of said device;

at least one hourglass shaped metallically conductive connection through said planar supporting member electrically connecting at least the said one region of said device to at least a portion of said metallization layer on the bottom planar surface of said supporting member; and a plurality of solder pads for connecting the metallization layer on the bottom planar surface to a conductive circuit pattern on a substrate, thereby precisely positioning said optical device with respect to said substrate.

2. A structure as described in claim 1 wherein a plurality of devices are formed on each of the planar surfaces of said supporting member.

3. A structure as in claim 2 wherein the conductive connections also connect selected portions of the active devices on each of the said planar surfaces of said supporting member.

4. A structure as in claim 1 wherein the conductive connection through said planar supporting member consists of aluminum.

5. An integrated semiconductor structure as in claim 1 additionally comprising:

a thermal path joining the bottom planar surface of said supporting member to said substrate.

6. An integrated semiconductor structure as in claim 1 wherein a plurality of said planar supporting members are joined by solder pads, thereby providing a three-dimensionally integrated semiconductor structure.

7. An integrated semiconductor structure as in claim 1 wherein a plurality of semiconductor devices formed in the top planar surface of said supporting member include:

active and passive semiconductor devices, selected regions of said devices being electrically connected by said metallization layer.

* * * * *